(12) United States Patent
Liu

(10) Patent No.: US 7,733,080 B1
(45) Date of Patent: Jun. 8, 2010

(54) REVOLVABLE CLAMP METER

(75) Inventor: Shaw-Lin Liu, Taipei (TW)

(73) Assignee: Chung Instrument Electronics Industrial Co., Ltd., Taipei (TW)

( * ) Notice: Subject to any disclaimer, the term of this patent is extended or adjusted under 35 U.S.C. 154(b) by 0 days.

(21) Appl. No.: 12/274,355

(22) Filed: Nov. 20, 2008

(51) Int. Cl.
*G01R 1/20* (2006.01)
*G01R 1/04* (2006.01)
*G01R 19/00* (2006.01)

(52) U.S. Cl. .................. 324/126; 324/156; 324/133; 324/127; 439/858; 439/822

(58) Field of Classification Search ......... 324/126–127, 324/133, 156; 439/822, 858
See application file for complete search history.

(56) References Cited

U.S. PATENT DOCUMENTS

| | | | |
|---|---|---|---|
| 4,476,721 A * | 10/1984 | Hochreuther et al. ......... | 73/431 |
| 5,349,289 A * | 9/1994 | Shirai ........................... | 324/127 |
| 5,610,512 A * | 3/1997 | Selcuk ......................... | 324/127 |
| 6,091,237 A * | 7/2000 | Chen ............................ | 324/142 |
| 6,456,060 B1 * | 9/2002 | Wiesemann .................. | 324/127 |
| 6,975,104 B2 * | 12/2005 | Gregorec, Jr. ............... | 324/126 |
| 7,018,247 B1 * | 3/2006 | Ranta et al. .................. | 439/858 |

\* cited by examiner

*Primary Examiner*—Ha Tran T Nguyen
*Assistant Examiner*—Emily Y Chan
(74) *Attorney, Agent, or Firm*—Leong C. Lei

(57) ABSTRACT

The clamp meter contains a revolving member configured between the meter's body member and jaw member. The revolving member is composed of a first base and a second base located on the interfacing sides of the body member and the jaw member, respectively. The first base and the second base are revolvably joined together by an axle extended axially from the body member into the jaw member via the first and second bases' aligned axle holes. The first base has at least a roller ball elastically embedded in a concave and exposed towards the second base. The roller ball would roll into one of a number of notches of the second base as the base and jaw members are rotated relative to each other, thereby creating a number of preset configurations of the included angle between the body and jaw members.

3 Claims, 7 Drawing Sheets

US 7,733,080 B1

REVOLVABLE CLAMP METER

TECHNICAL FIELD OF THE INVENTION

The present invention generally relates to clamp meters, and more particularly to a clamp meter whose jaw member and body member are capable of revolving relative to each other so that the clamp meter's display panel could be conveniently turned to face the operator for easy reading.

DESCRIPTION OF THE PRIOR ART

As shown in FIG. 7, a clamp meter is an electrical device having a body member 41 and a jaw member 42. The jaw member 42 has two jaws which open to allow clamping around an electrical cable L. This allows the electrical current or other electrical characteristic in the cable L to be measured, without having to make physical contact with the cable L, and the measurement is shown in a display panel 411 of the body member 41.

A major inconvenience of the clamp meter is that, when the meter clamps the cable L, the display panel 411 is quite often not facing the operator of the clamp meter. Either the clamp meter has to be twisted or the operator has to turn his head so as to read the measurement on the display panel 411. There are circumstances that, for example, when the cable L is located in a box B and the display panel 411 is facing a lateral side B1 of the box B, it is extremely difficult for the operator to read the measurement.

SUMMARY OF THE INVENTION

Therefore a novel clamp meter is provided where its jaw member and body members are capable of revolving relative to each other and the clamp meter's display panel therefore could be conveniently turned to face the operator for easy reading.

The clamp meter contains a revolving member configured between the meter's body member and jaw member. The revolving member is composed of a first base and a second base located on the interfacing sides of the body member and the jaw member, respectively. The first base and the second base are revolvably joined together by an axle extended axially from the body member into the jaw member via the first and second bases' aligned axle holes. The first base has at least a roller ball elastically embedded in a concave and exposed towards the second base. The roller ball would roll into one of a number of notches of the second base as the base and jaw members are rotated relative to each other, thereby creating a number of preset configurations of the included angle between the body and jaw members.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
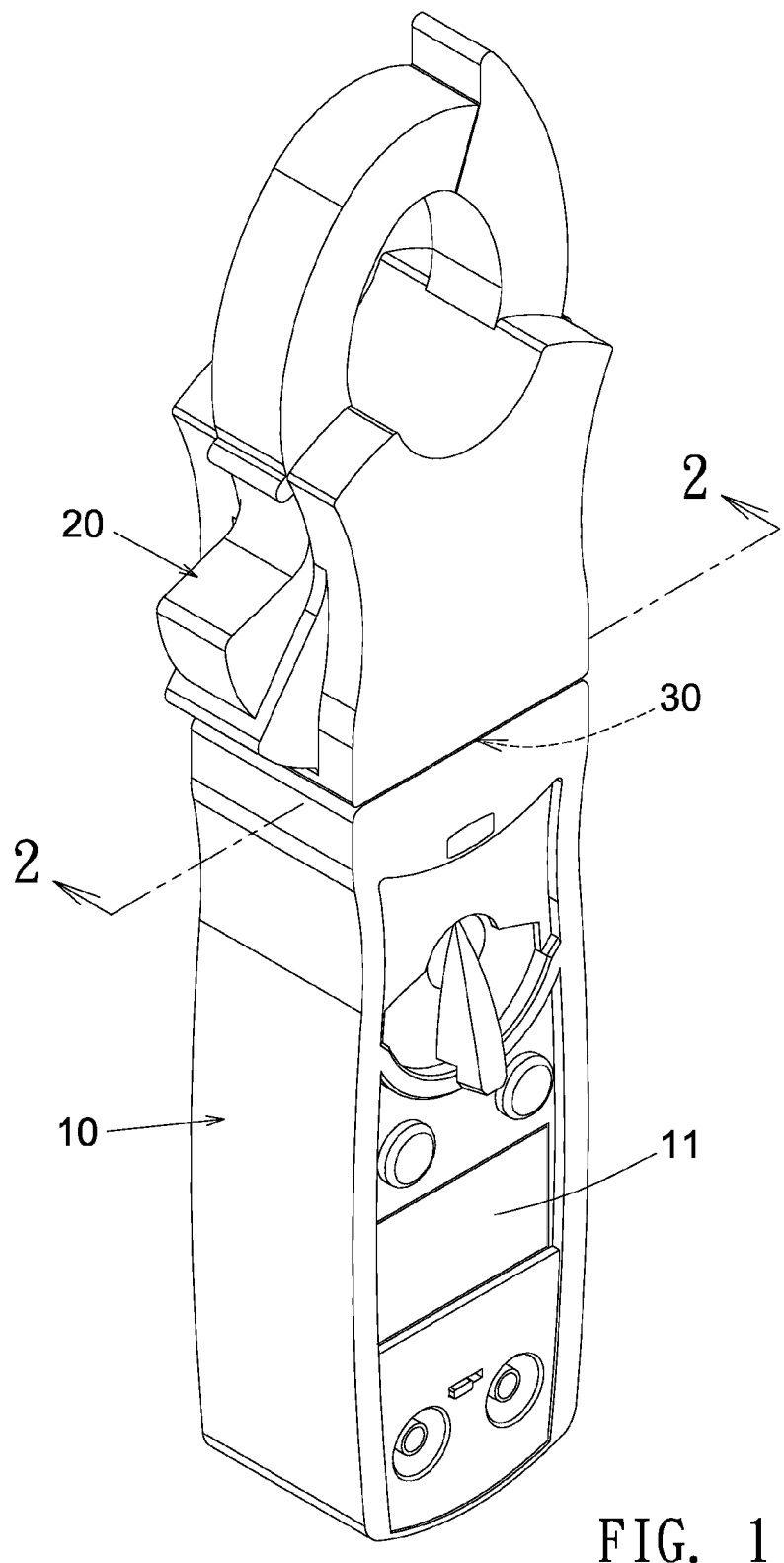
FIG. 1 is a perspective diagram showing a clamp meter according to an embodiment of the present invention.
Figure 2:
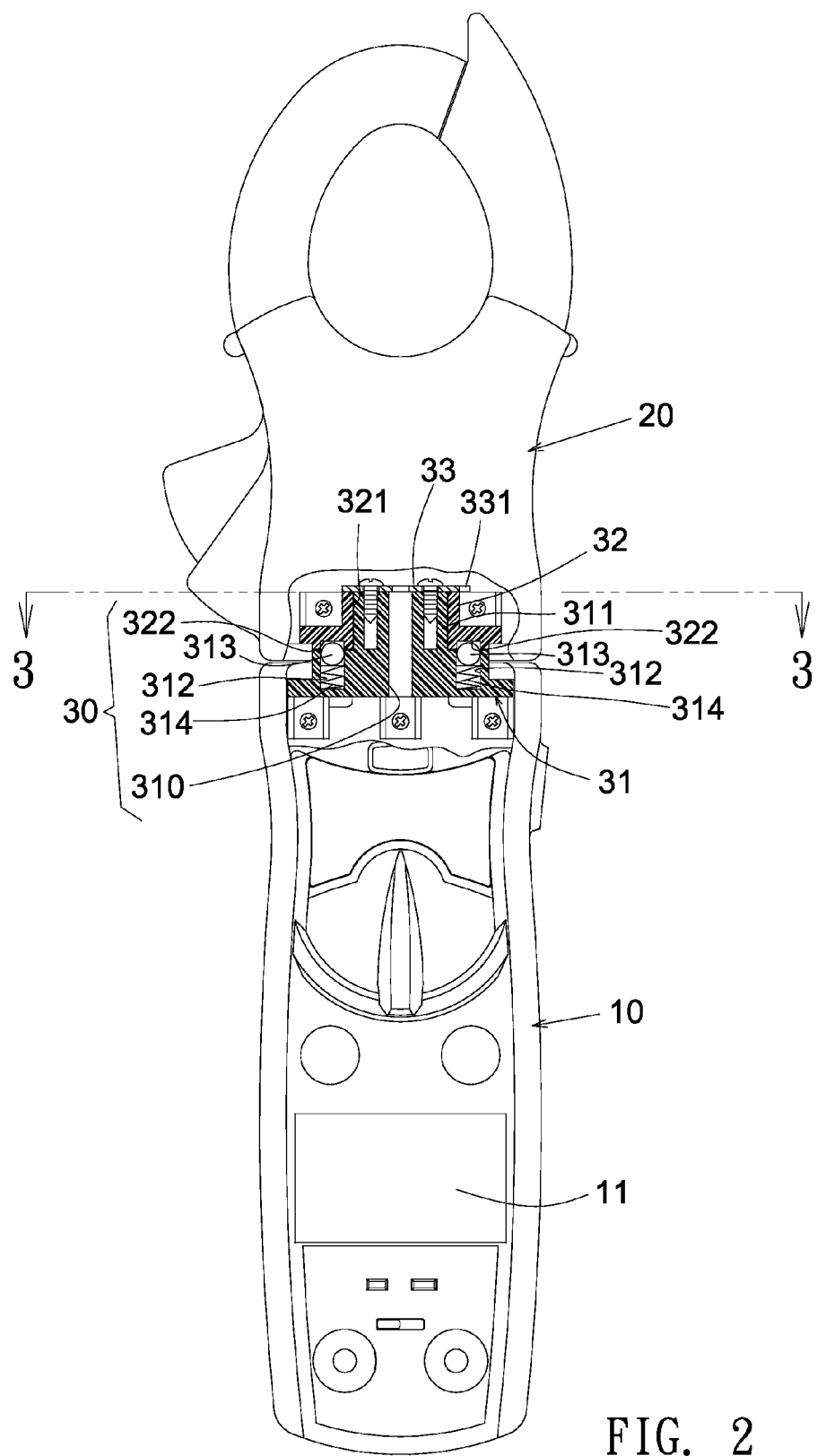
FIG. 2 is a sectional diagram showing the clamp meter of FIG. 1 viewed from the direction marked 2-2 in FIG. 1.
Figure 3:
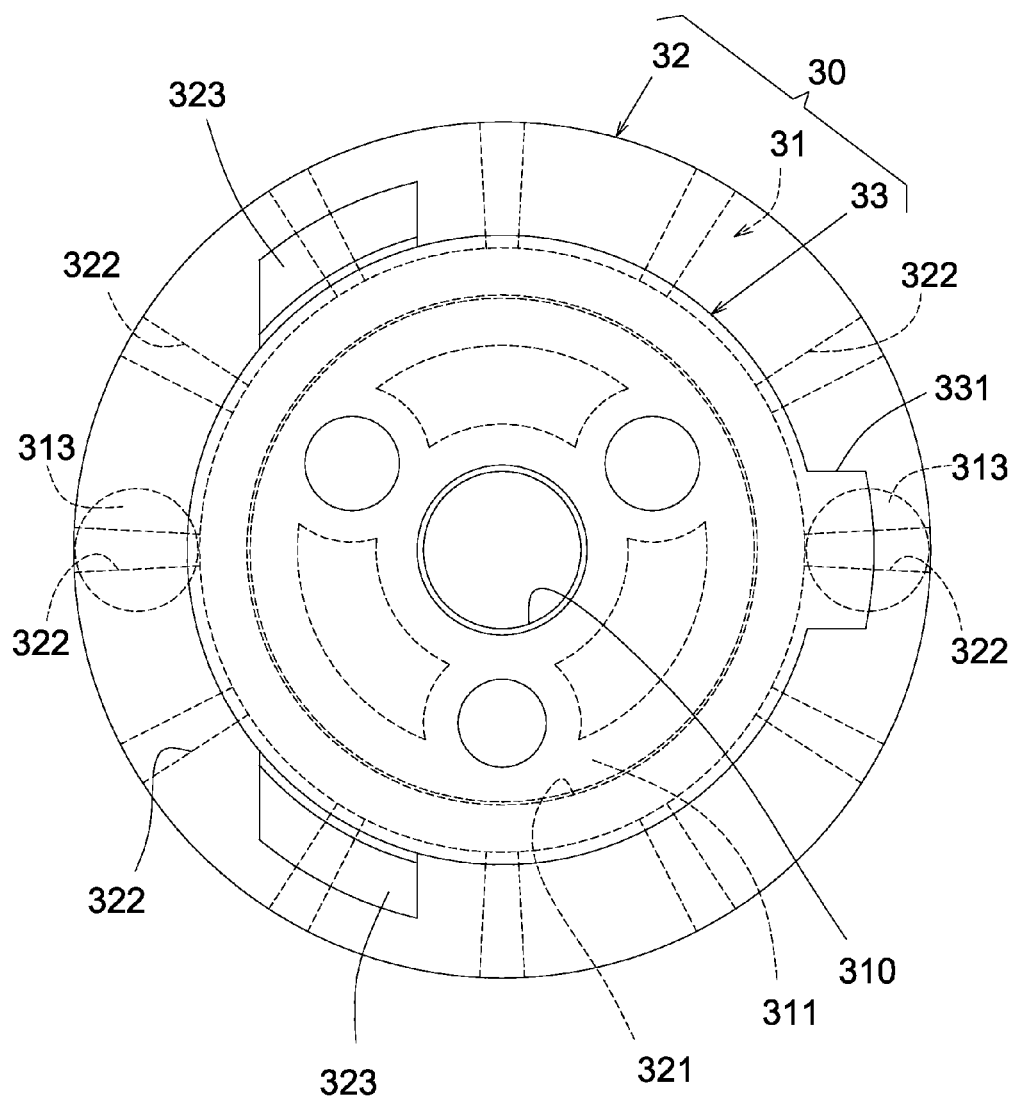
FIG. 3 is a cross-sectional diagram showing the clamp member of FIG. 1 viewed from the direction marked 3-3 in FIG. 2.
Figure 4:
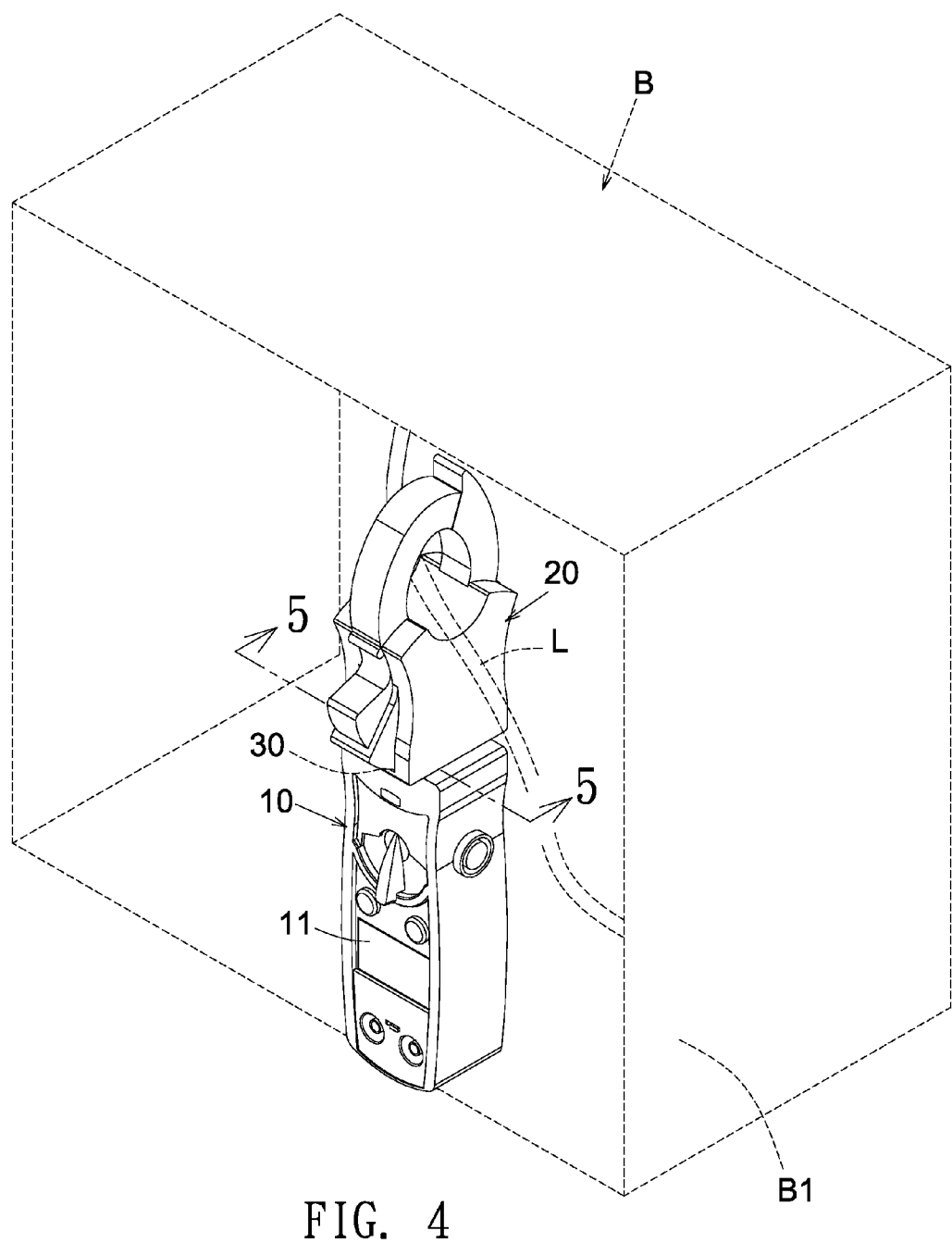
FIG. 4 is a perspective diagram showing an operational scenario of the clamp meter of FIG. 1 in measuring a cable inside a box where the jaw and body members are at 90 degrees relative to each other.
Figure 5:
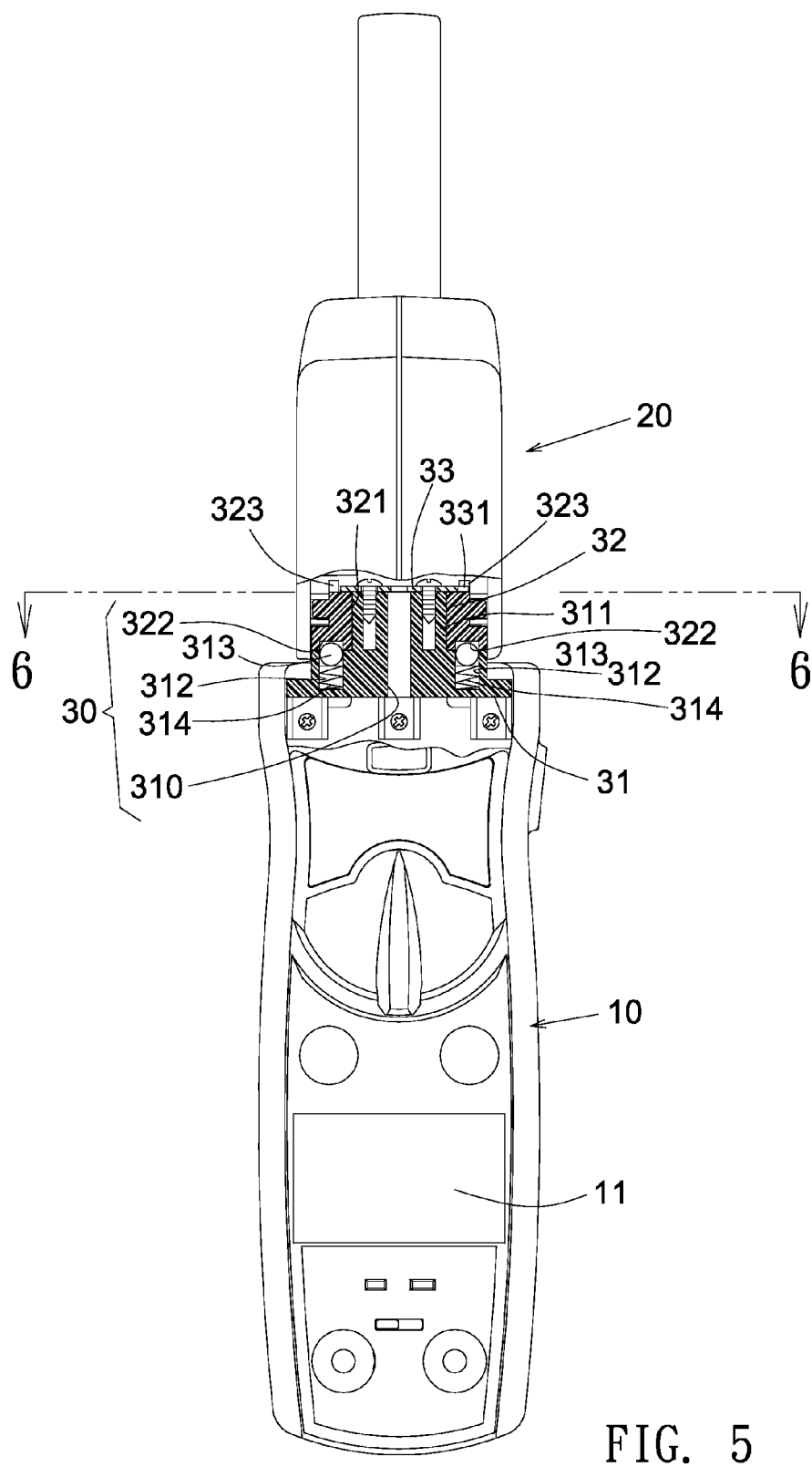
FIG. 5 is a sectional diagram showing the clamp meter of FIG. 1 viewed from the direction marked 5-5 in FIG. 4.
Figure 6:
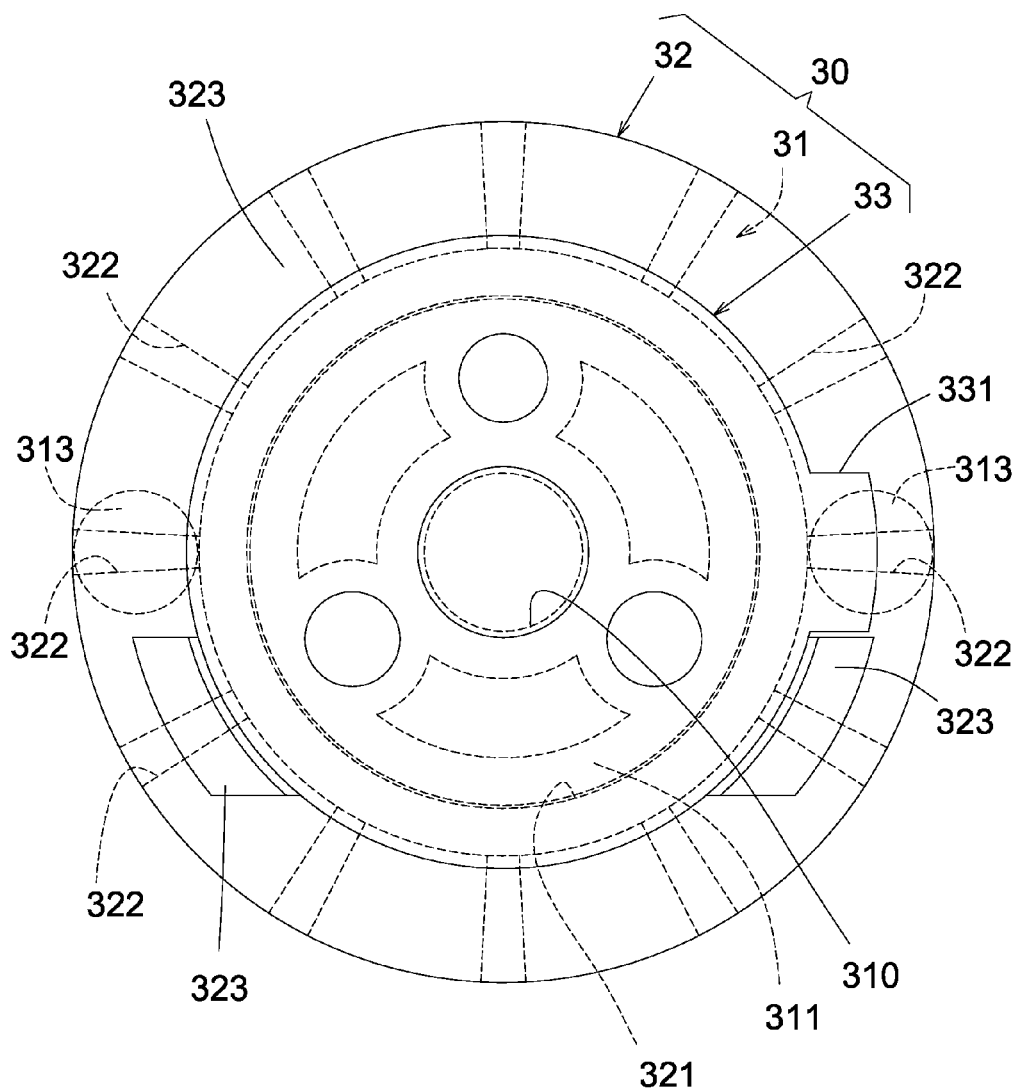
FIG. 6 is a cross-sectional diagram showing the clamp member of FIG. 1 viewed from the direction marked 6-6 in FIG. 5.
Figure 7:
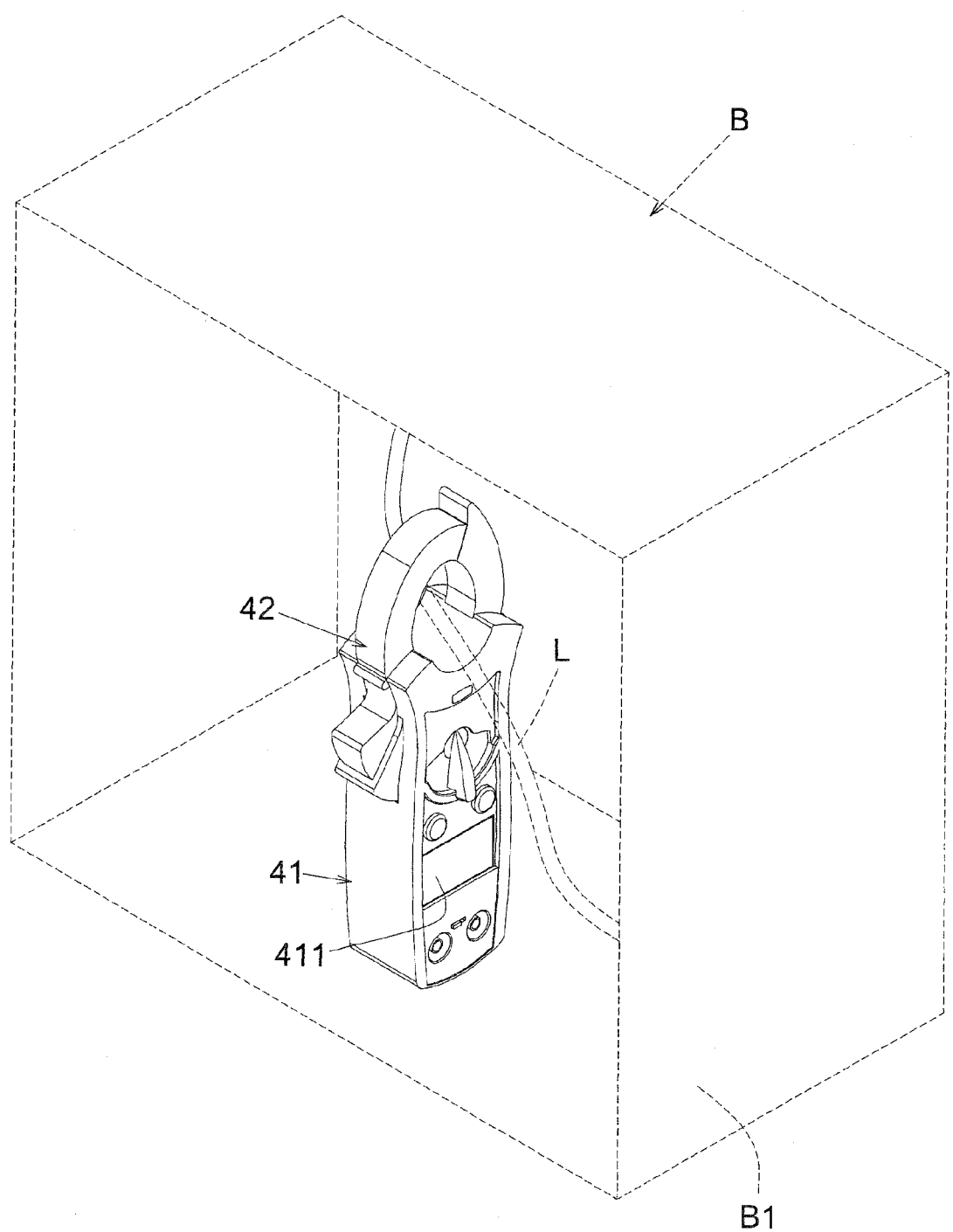
FIG. 7 is a perspective diagram showing an operational scenario of a conventional clamp meter in measuring a cable inside a box.

As shown in FIGS. 1 to 6, a clamp meter according to an embodiment of the present invention contains a body member 10 having a display panel 11, and a jaw member 20 at an end of the body member 10 for clamping around a cable L. The clamp meter measures a current or other electrical characteristic of the cable L and displays the measurement in the display panel 11. The clamp meter further contains a revolving member 30 composed of a first base 31 and a second base 32 located on the interfacing sides of the body member 10 and the jaw member 20, respectively. The first base 31 and the second base 32 are revolvably joined together so that, when the clamp meter clamps the cable L, its body member 10 or jaw member 20 could be turned to make the display panel 11 to face the operator, as illustrated in FIG. 4. The clamp meter's measurement is therefore much more convenient to read.

The first base 31 has a through first axle hole 310 so that an axle 311 is extended axially from the body member 10 via the first axle hole 310. Correspondingly, the second base 32 has a second axle hole 321 aligned with the first axle hole 310 to receive the axle 311. As such, the first and second bases 31 and 32 are revolvably joined together. Along an interfacing face of the first base 31 with the second base 32, at least a roller ball 313 is provided around the first axle hole 310. The roller ball 313 is housed in a concave 312 and a spring 314 inside the concave 312 elastically supporting the roller ball 313 so that the roller ball 313 is raised towards the second base 32 or suppressed entirely into the concave 312. Similarly, along an interfacing face of the second base 32 with the first base 31, a number of notches 322 are provided around the second axle hole 321. The notches 322 are positioned such that, as the body member 10 and the jaw member 20 are rotated relative to each other, the roller ball 313 would roll into one of the notches 322 along the way, thereby creating a number of preset configurations of the included angle between the body and jaw members 10 and 20.

The revolving member 30 could further contain a flat disc 33 fixedly and perpendicularly joined to an end of the axle 311 that penetrates through the second base 32. The diameter of the disc 33 is larger than that of the second axle hole 321 so that the second base 32 is reliably sandwiched between the disc 33 and the first base 31.

On an interfacing face of the disc 33 with the second base 32, a first protrusion 331 towards the second base 32 is provided. On the other hand, on an interfacing face of the second base 32 with the disc 33, at least a second protrusion 323 towards the disc 33 is provided. As such, when the body member 10 and the jaw member 20 are engaged into a relative rotation, they will be stopped at some point instead of continuously revolving around each other. For example, when the jaw member 20 is twisted clockwise or counterclockwise, it could be twisted only up to 90 degrees and cannot be twisted further due to the blocking of the first and second protrusions 331 and 323.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A clamp meter, comprising:
a body member having a display panel;
a jaw member; and
a revolving member joining said body and jaw members together, said revolving member having a first base located on said body member, a second base located on said jaw member, and an axle extended axially from said body member into said jaw member via a first axle hole of said first base and a second axle hole of said second base so that said body and jaw members are capable of revolving relative to each other;
wherein at least a roller ball is embedded in a concave on said first base around said first axle hole; said roller ball is elastically supported by a spring inside said concave so that said roller ball is raised towards said second base or suppressed entirely into said concave; a plurality of notches are provided on said second base around said second axle hole; said notches are positioned such that, as said body member and said jaw member are rotated relative to each other, said roller ball rolls into one of said notches, thereby creating a number of preset configurations of the included angle between said body and jaw members.

2. The clamp meter according to claim 1, wherein said revolving member further contains a flat disc fixedly and perpendicularly joined to an end of said axle; the diameter of said disc is larger than that of said second axle hole so that said second base is reliably sandwiched between said disc and said first base.

3. The clamp meter according to claim 2, wherein said disc has a first protrusion towards said second base; said second base has at least a second protrusion towards said disc; as such, said body member and said jaw member are rotated relative to each only up to a specific angle, clockwise or counterclockwise.

* * * * *